United States Patent
Freidhof et al.

(10) Patent No.: US 6,947,508 B2
(45) Date of Patent: Sep. 20, 2005

(54) METHOD AND APPARATUS FOR ESTIMATING THE FREQUENCY AND/OR PHASE OF A DIGITAL SIGNAL

(75) Inventors: Markus Freidhof, Taufkirchen (DE); Kurt Schmidt, Grafing (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 784 days.

(21) Appl. No.: 09/928,402

(22) Filed: Aug. 14, 2001

(65) Prior Publication Data

US 2002/0034272 A1 Mar. 21, 2002

(30) Foreign Application Priority Data

Aug. 14, 2000 (DE) .......................... 100 39 666

(51) Int. Cl.[7] ............................................... H04B 1/10
(52) U.S. Cl. ...................... 375/350; 375/350; 375/375; 375/240.12; 375/329; 375/334; 375/323; 375/362; 455/154.1
(58) Field of Search ................................ 375/350, 375, 375/240.12, 329, 334, 323, 362; 455/154.1

(56) References Cited

U.S. PATENT DOCUMENTS

| | | | | | |
|---|---|---|---|---|---|
| 4,634,989 A | * | 1/1987 | Mehrgardt | .................. | 329/343 |
| 5,148,167 A | * | 9/1992 | Ribner | ........................ | 341/143 |
| 6,614,841 B1 | * | 9/2003 | Ohta | .......................... | 375/232 |

FOREIGN PATENT DOCUMENTS

DE 4211946 9/1993
DE 4302679 8/1994

OTHER PUBLICATIONS

Wolf, Jack K., Schwartz, Jay W.: IEEE Transactions On Communications, vol. 38, No. 1, Jan. 1990, S.124–127.
Chu, Shuni, Burrus, Sidney C.: IEEE Transactions On Circuits And Systems, vol. CAS–31, No. 11, Nov. 1984, S.913–924 Fig. 6,S.916.
Hagiwara, Masafumi, et al.: Electromics and Communications in Japan, vol. 67–B, No. 10, 1984, S.66–74; Fig. 1.
Hogenauer, Eugene B.: IEEE Transsactions On Acoustics, Speech, And Signal Processing, vol. ASSP–29, No. 2, Apr. 1981, S.155–162; S.156.

* cited by examiner

*Primary Examiner*—Mohammed Ghayour
*Assistant Examiner*—Juan Alberto Torres
(74) *Attorney, Agent, or Firm*—Birch, Stewart, Kolasch & Birch, LLP

(57) ABSTRACT

An apparatus and method for estimating a frequency and/or a phase of a digital input signal by determining phase values of the input signal. The phase values are then added over a predetermined summation length N/B. The sampling rate of the added-up phase values are reduced by a factor N/B in comparison with the sampling rate of the phase values. The added-up phase values are delayed in a chain of at least B–1 delay elements. The differently-delayed added-up phase values are then added or subtracted to create a resulting pulse response of the frequency such that the resulting pulse response of the frequency is constant positive in a first interval, is zero in a second interval and is constant negative in a third interval, so that a resulting pulse response of the phase is constant in at least a middle interval or is otherwise zero.

18 Claims, 3 Drawing Sheets

METHOD AND APPARATUS FOR ESTIMATING THE FREQUENCY AND/OR PHASE OF A DIGITAL SIGNAL

BACKGROUND OF THE INVENTION

This application claims a priority from German patent application No. 100 39 666.6, filed Aug. 14, 2000, and the contents of that application are incorporate herein by reference.

This invention relates to a method and an apparatus for estimating the frequency and/or phase of a digital signal.

A method of estimating frequency is disclosed by J. K. Wolf and J. W. Schwartz, "Comparison of Estimators for Frequency Offset," IEEE Transactions on Communications, vol. 38, no. 1, January 1990, pages 124–127. It is proposed in this article that the phase of a complex digital input signal be differentiated and that the differentiated phase be fed to an averaging filter. This article shows that the ideal pulse response of the averaging filter is parabolic. The parabolic curve of the pulse response of the averaging filter can be approximated relatively well by a trapezoidal curve with an increasing range, a constant range and a descending range. The standard deviation of the estimation error increases by only about 6% in comparison with using the ideal averaging filter with the parabolic pulse response. Therefore, this could be termed a sub-optimal frequency estimator.

If the filter with the trapezoidal pulse response mentioned in the above article were to be implemented directly, a relatively large number of multiplications would have to be performed because each sample value within an observation interval must be multiplied by a corresponding coefficient.

Therefore, it is an object of this invention to provide a method and an apparatus for estimating the frequency and/or the phase of a digital input signal, which preferably works without logic-gate-intensive multipliers.

SUMMARY OF THE INVENTION

With regard to the method, this object is achieved by: determining the phase values of an input signal; summing, or adding up, these input-signal phase values over a predetermined summation length N/B which is a predetermined fraction 1/B of an observation length of N phase values, to create added-up phase values; reducing the sampling rate of the added-up phase values by the factor N/B in comparison with a sampling rate of the input-signal phase values; delaying the added-up phase values with at least B−1 delay elements, each of which delays the added-up phase value by one sampling period of the reduced sampling rate; adding up the differently-delayed added-up phase values to create a resulting pulse response of the frequency so that the resulting pulse response of the frequency is constant positive in a first interval, is zero in a second interval and is constant negative in a third interval, and/or a resulting pulse response of the phase such that the resulting pulse response of the phase is constant in at least a middle interval of the observation length and is otherwise zero.

With regard to an apparatus, this object is achieved by having: a phase recording device which determines the phase value of an input signal; a first filter, which adds up the input-signal phase values over a predetermined summation length N/B, which is a predetermined fraction 1/B of an observation length of N phase values, to form added-up phase values, and reduces the sampling rate of the added-up phase values by a factor N/B in comparison with a sampling rate of the input-signal phase values; a second filter which delays the added-up phase values in a chain of at least B−1 delay elements, each of which delays the added-up phase values by one sampling period of the reduced sampling rate, and adds or subtracts the differently-delayed added-up phase values, to create a resulting pulse response of the frequency so that a resulting pulse response of the frequency is constant positive in a first interval, is zero in a second interval and is constant negative in a third interval, and/or they are added to create a resulting pulse response of the phase so that the resulting pulse response of the phase is constant in at least a middle interval and is otherwise zero.

Advantageous refinements and enhancements of this invention are also set forth herein.

This invention firstly makes use of the recognition that it is more advantageous to start with phase values of the input signal rather than phase difference values to estimate the frequency and phase. Accordingly, a pulse response of an ideal averaging filter varies from a parabolic curve to a curve that descends linearly from positive values to negative values. The sub-optimal pulse response, which represents a good approximation to the ideal pulse response, has then first a positive square-wave range, a range where the pulse response is 0, and a negative square-wave range. The ideal pulse response for the phase is constant over the entire observation length. The component sections with a constant course of the pulse response correspond to a summation of the phase values in these component ranges. By a simultaneous reduction of the sampling rate, the summed phase values are made available at the output of the first filter stage timed with, or in cycle with, the fraction of the observation length that corresponds to the constant component ranges of the pulse response. In a second filter stage, the phase values at this reduced timing are delayed and then are added together or subtracted from one another so that the above-described characteristic curve of the resulting pulse response is obtained for the estimated frequency and/or the estimated phase.

The first filter stage can be implemented by a series connection of an integrator, a sampling rate converter and a following differentiator. In this regard, the integrator continuously adds up or integrates the phase values, while the differentiator subtracts the starting value at the beginning of the summation interval from the final value at the end of the summation interval.

In an especially advantageous embodiment of this invention, the resulting pulse response for the phase is constant only during a middle interval that is $\frac{2}{3}$ the total observation length and is otherwise is equal to 0. However, the resulting pulse response for the frequency is constant and positive in the first third of the observation length, is equal to 0 in the second third of the observation length and is constant and negative in the third of the observation length. In comparison with a completely constant pulse response over the complete total observation length for the phase estimate, this has the advantage that the pulse response can be broken down into blocks of one sixth of the total observation length and can be added up or subtracted with a suitable standardization of these blocks so that the desired resulting pulse response for the phase and for the frequency can be created without multiplication, because the result is subject only to a factor of an integral power of the base 2 and thus, instead of multiplication, only bit shifting or a shifting of the value of the bits must be performed in interpreting the results.

BRIEF DESCRIPTION OF THE DRAWINGS

Two embodiments of this invention are described in greater detail below with reference to the drawings. The described and drawn features can be used individually or in preferred combinations in other embodiments of the invention. The foregoing and other objects, features and advantages of the invention will be apparent from the following more particular description of the invention, as illustrated in the drawings in which reference characters refer to the same parts throughout the different views. The drawings are not necessarily to scale, emphasis instead being placed upon illustrating principles of the invention in a clear manner.

DETAILED DESCRIPTION OF THE INVENTION

Figure 1:
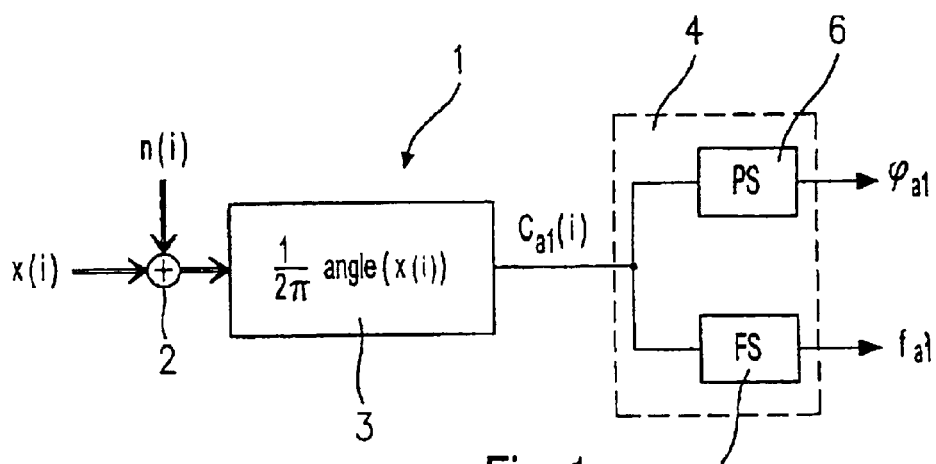
FIG. 1 is a block diagram of an apparatus of this invention for estimating the frequency and phase of a digital input signal.

FIG. 1 shows a basic structure of an apparatus 1 of this invention for estimating the frequency $f_{a1}$ and/or phase ($\phi_{a1}$ of a digital input signal x(i). The frequency $f_{a1}$ and phase $\phi_{a1}(T_0)$ of a rotational vector at time point $T_0$ are to be estimated from sample values x(i) of the complex rotational indicator, or vector. In this regard, the input signal x(i) may contain additive interference n(i), for example in the form of white noise with a Gaussian distribution, which is constructively shown added in an equivalent summing unit 2.

In a phase recording, or determining, device 3, phase values $C_{a1}(i)$ of the input signal x(i) are determined from the following equation, where they are standardized to $2\pi$:

$$C_{a1}(i) = \text{angle}(x(i))/2\pi \tag{1}$$

Sample values are obtained by sampling at times $t_i = i \cdot T_{a2}$ and can be represented as follows:

$$x(i) = \exp \cdot (j(2\pi f_{a1} \cdot i \cdot T_{a2} + \phi_0)) \tag{2}$$

where $f_{a1}$ denotes the frequency of the input signal x(i) to be estimated, and $T_{a2}$ is the sampling period of sampling frequency $f_{a2} = 1/T_{a2}$ with which the input signal x(i) is sampled. N values of an observation length of N phase values $C_{a1}(i)$ over an observation time $T = N \cdot T_{a2}$ are used to estimate the frequency $f_{a1}$ and phase $\phi_{a1}$ as follows:

$$C_{a1} = (C_{a1}(0), C_{a1}(1), \ldots, C_{a1}(N-1)) \tag{3}$$

where $C_{a1}$ is a vector (vectors are printed in bold in this patent application) of N phase values standardized to $2\pi$. If it is assumed that the interference n(i) is a Gaussian-distribution white noise signal, a vector of optimal weighting factors $W_f^{opt}$ for estimating the frequency $f_{a1}$ can be determined by using the maximum likelihood theory (see, for example, J. K. Wolf and J. W. Schwartz, "Comparison of Estimators for Frequency Offset," loc. cit.), where the optimal estimated frequency $f_{a1}^{opt}$ can be determined by vector multiplication as follows:

$$f_{a1}^{opt} = W_f^{opt} \cdot C_{a1}^T \tag{4}$$

where $w_f^{opt}$ is a vector of N weighting coefficients $w_f^{opt}(i)$:

$$W_f^{opt} = (w_f^{opt}(0), w_f^{opt}(1), \ldots, w_f^{opt}(N-1)) \tag{5}$$

where $$w_f^{opt}(i) = \frac{12 \cdot i - 6 \cdot (N-1)}{(N-1) \cdot (N+1) \cdot T_{a2}} \tag{6}$$

Averaging with the weights $w_f^{opt}$ is performed in the frequency estimator 5 of the estimator 4 that follows the phase recording device 3. The estimated frequency $f_{a1}$ of the input signal x(i) is available at the output of frequency estimator 5.

Figure 2:
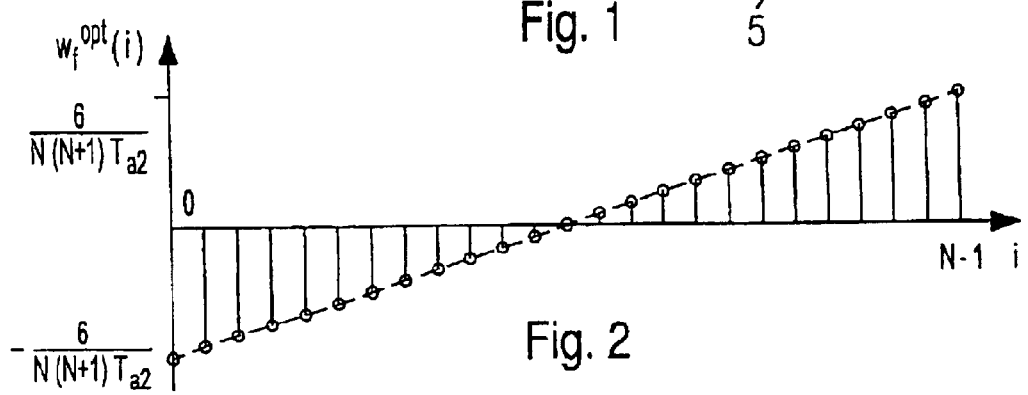
FIG. 2 is a graph of the ideal weighting coefficient $w_f^{opt}$ for estimating the frequency.

FIG. 2 shows the weighting coefficients $w_f^{opt}(i)$ according to equation (6), which illustrates the linear increase in weights with an increase in index i. By integrating the function of FIG. 2 of the weighting coefficients one gets the parabolic characteristic curve of the weighting coefficients given by J. K. Wolf and J. E. Schwartz, "Comparison of Estimators for Frequency Offset," loc. Cit., for the estimate based on the phase difference values.

Figure 3:
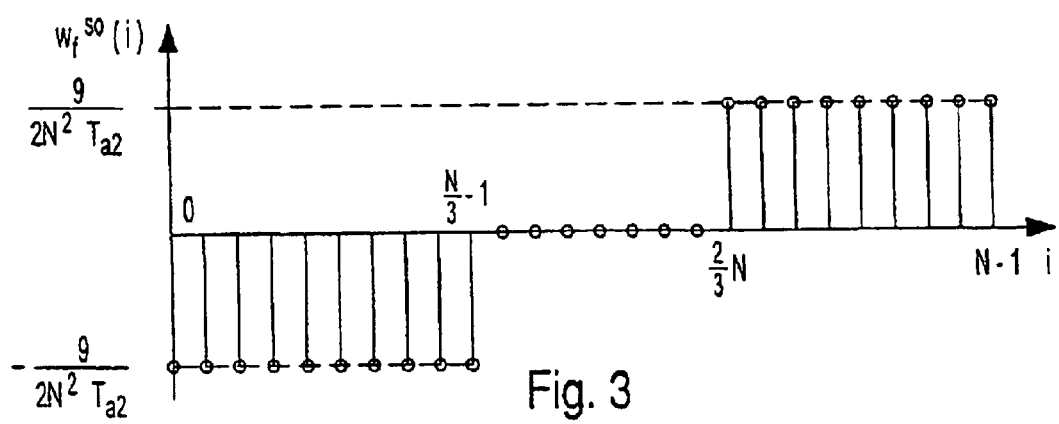
FIG. 3 is a graph of the sub-optimal weighting coefficient $w_f^{so}$ for estimating the frequency.

Direct implementation of optimal weighting coefficients given in equation (6) and illustrated in FIG. 2 has the disadvantage that a great many multiplication operations must be performed because the weighting coefficients $w_f^{opt}(i)$ are different for each sample. In the case of a hardware implementation, this leads to a high logic-gate complexity. Therefore, it is proposed that instead of the optimal weighting coefficients $w_f^{opt}(i)$, sub-optimal, approximated weighting coefficients $w_f^{so}(i)$ be used, as illustrated in FIG. 3. To do so, the observation length N is divided into three component ranges, each with a length of N/3. In the first third between 0 and N/3−1, the weighting coefficients are constant negative; in a second third between N/3 and ⅔N−1, the weighting coefficients are constant 0; and in a third one-third between ⅔N and N−1, the weighting coefficients are constant positive. The sub-optimal weighting coefficients $w_f^{so}(i)$ are then calculated according to the following equation:

$$w_f^{so}(i) = -9/(2 \cdot N^2 \cdot T_{a2}) \quad \text{for } 0 \le i < N/3 \tag{7}$$
$$w_f^{so}(i) = 0 \quad \text{for } N/3 \le i < 2N/3$$
$$w_f^{so}(i) = -9/(2 \cdot N^2 \cdot T_{a2}) \quad \text{for } 2N/3 \le i < N$$

The standard deviation of the estimation error increases by only about 6% in comparison with the use of the optimal weighting coefficient $w_f^{opt}(i)$. This can therefore be termed a sub-optimal frequency estimator.

The phase $\phi_{a1}$ at the optimal estimation time $T_0^{opt} = (N-1) \cdot T_{a2}/2$ can also be estimated with a phase estimator 6 of the estimator 4 by multiplying the vector $C_{a1}$ times the weighting vector $w_f^{opt}$ as follows:

$$\phi a1(T_0^{opt}) = w_\phi^{opt} \cdot C_{a1}^T \tag{8}$$

where $$w_\phi^{opt}=(w_\phi^{opt}(0), w_\phi^{opt}(1), \ldots, w_\phi^{opt}(N-1)) \quad (9)$$

For the weights $w_\phi^{opt}(i)$ the following holds:

$$w_\phi^{opt}(i)=2\pi/N \quad (10)$$

Figure 4:
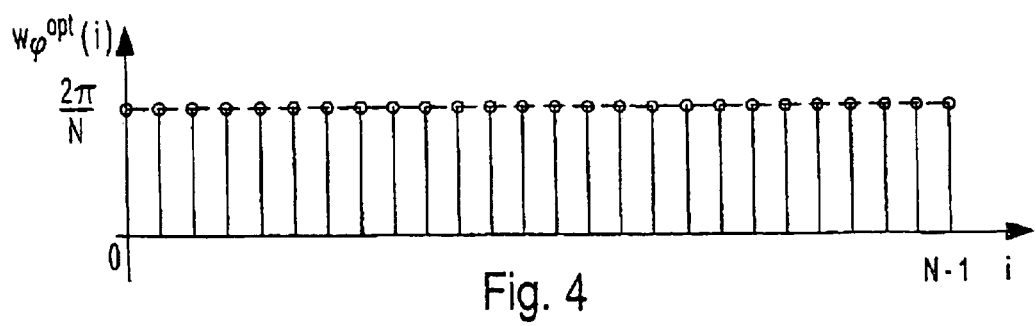
FIG. 4 is a graph of the optimal weighting coefficient $w_\phi^{opt}$ for estimating the phase.

The optimal weighting coefficients $w_\phi^{opt}(i)$ for estimation of the phase $\phi_{a1}$ are thus constant over the entire observation length N. An approximation by means of sub-optimal weighting coefficients is not necessary for the phase because of this detail. The weighting coefficients $w_\phi^{opt}(i)$ are shown in FIG. 4 as a function of the index i.

Figure 5:
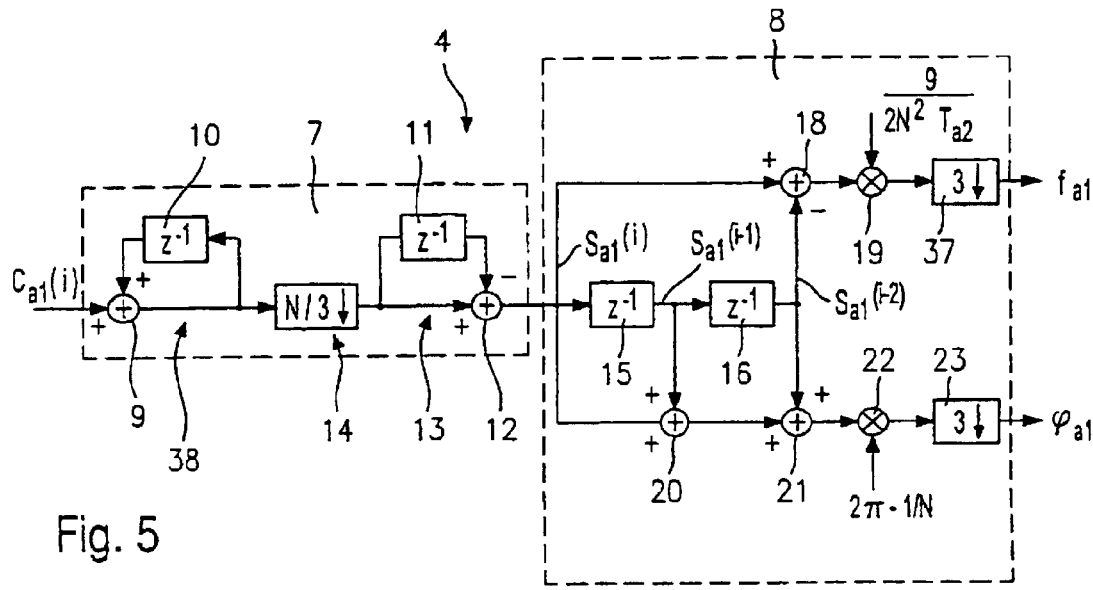
FIG. 5 is a block diagram of a first embodiment of an estimator.

FIG. 5 shows an implementation of the estimator 4 according to a first embodiment of this invention.

The estimator 4 is roughly divided into a first filter 7 and a following second filter 8. The first filter 7 is a cic (cascaded integrator comb) filter of the first order. The first filter 7 includes an integrator 38 with an adder 9 and a delay element 10, a differentiator 13 with a delay element 11 and a subtractor 12, as well as a sample-rate converter 14 (down-sampler) arranged between the integrator 38 and the differentiator 13 or difference former. The sample-rate converter 14 reduces the sampling rate $f_{a2}$ of the phase values $C_{a1}$ at the input of the first filter 7 by the factor N/3 in this embodiment, where N stands for the observation length, that is, the number of observed phase values $C_{a1}(i)$ during the observation time $N \cdot T_{a2}$. The integrator 10 continuously adds up various phase values $C_{a1}(i)$ supplied to it. The sampling-rate converter 14, in combination with the differentiator 13, limits the summation length to N/3, because the differentiator 13 subtracts the starting value at the beginning of the summation from the end value of the summation over N/3 phase values $C_{a1}(i)$. Therefore, after N/3 sampling periods $T_{a2}$ of the phase values $C_{a1}(i)$, a sum value which is referred to below as the added-up phase value $S_{a1}(i)$, is obtained at the output of the first filter 7 and represents the sum of the previous phase values $C_{a1}(i)$.

These added-up phase values $S_{a1}(i)$ are fed to the second filter 8. In this embodiment, the second filter 8 includes two delay elements 15 and 16 which delay the added-up phase values $S_{a1}(i)$ in a timing cycle $(3/N) \cdot f_{a2}$ by one sampling period $N \cdot T_{a2}/3$ each. In this regard, the added-up phase value $S_{a1}(i)$ is fed to the "+" input of a subtractor 18, whereas the added-up phase values $S_{a1}(i-2)$ which has been delayed by two sampling periods is fed to the "−" input of subtractor 8, so that the phase value $S_{a1}(i)$ is delayed by the delay time $2 \cdot N \cdot T_{a2}/3$ and appears inverted at the output of the subtractor 18.

Figure 6:
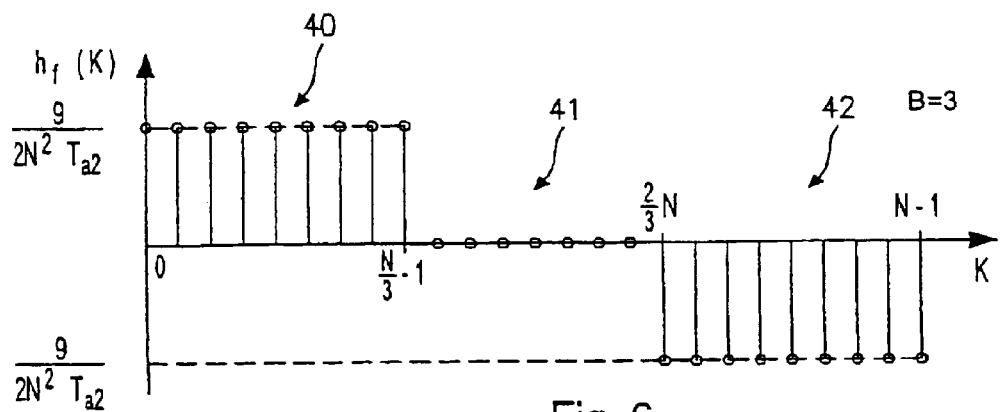
FIG. 6 is a diagram of a resulting pulse response $h_f$ for the frequency of the estimator shown in FIG. 5.

The cic filter 7 creates a square-wave pulse response with a constant positive coefficient over the length N/3. If the inverted pulse response is added to this with a delay of $2 \cdot N/3$, the resulting pulse response $h_f$ shown in FIG. 6 with an amplitude of 1 is obtained. By multiplying by the factor $9/(2 \cdot N^2 \cdot T_{a2})$ in a multiplier 19, the resulting pulse response $h_f$ shown in FIG. 6 is obtained for the frequency over the observation length N. Since the estimated value for the frequency is of interest only in the periodicity of the observation length N, in another sampling-rate converter 37 the sampling rate is reduced by a factor of 3 again, i.e., on the whole by a factor of N in comparison with sampling rate $f_{a2}$. By mirroring the pulse response $h_f$ shown in FIG. 6 on the ordinate which is shifted by N/2, the function of the sub-optimal weighting coefficient $w_f^{so}$ for the frequency as shown in FIG. 3 is obtained exactly. This mirroring on the offset ordinate corresponds to the different definition of the vector multiplication on which equation (4) is based in comparison with the definition of convolution or folding of the input sequence $C_{a1}(i)$ with the resulting pulse response $h_f$. As is known, the output function of a filter is obtained by folding the input function of the filter with the pulse response of the filter, which is equivalent to vector multiplication of the input sequence by the mirrored coefficients of the pulse response.

Figure 7:
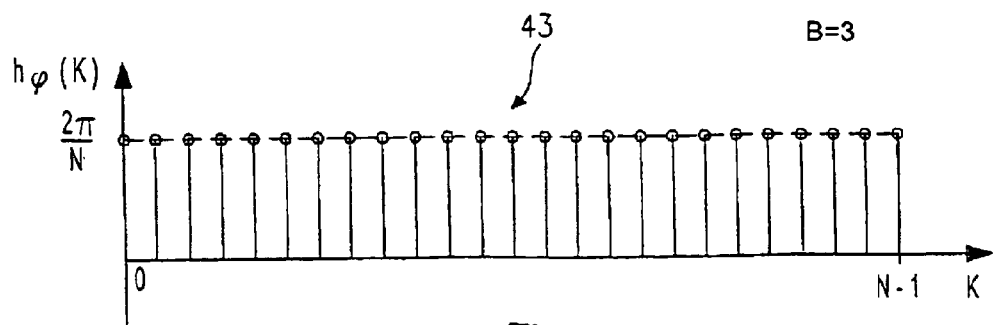
FIG. 7 is a diagram of the resulting pulse response $h_\phi$ for the phase of the estimator shown in FIG. 5.

The second filter 8 has two adders 20 and 21 for creating the resulting pulse response $h_\phi$ for estimation of the phase $\phi_{a1}$. The added-up phase value $S_{a1}(i)$ at the input of the first delay element 15, which adds up the added-up phase value $S_{a1}(i-1)$, which is delayed by $(N/3) \cdot T_{a2}$ at the output of the first delay element 15, and the added-up phase values $S_{a1}(i-2)$ which is shifted by $(2 \cdot N/3) \cdot T_{a2}$. As mentioned above, the cic filter 7 creates a positive constant (square-wave) partial pulse response of the length N/3. By adding three such partial pulse responses of the length N/3, this yields on the whole positive constant pulse response over the total observation length N. By multiplication by the factor $2\pi/N$ in the multiplier 22 and reducing the sampling rate by the remaining factor 3 in the sampling-rate converter 23, the resulting pulse response $h_\phi$ for the phase is obtained as shown in FIG. 7.

However, one disadvantage in the embodiment illustrated in FIG. 5 is that the factors $9/(2 \cdot N^2 \cdot T_{a2})$ and $2\pi/N$ of multipliers 19 and 22 are not an integral power of the base 2. Therefore, true multiplication is necessary in multipliers 19 and 22, not just a shift in the value of the bits of estimated frequency $f_{a1}$ which is represented in binary notation and estimated phase $\phi_{a1}$, necessitating a relatively great logic-gate complexity in implementing the circuitry. However, it should be emphasized that the gate complexity in the embodiment of FIG. 5 is clearly reduced in comparison with use of optimal weighting factors $h_f^{opt}$ shown in FIG. 2, because it is only necessary to perform multiplication after N/3 sampling periods $T_{a2}$.

Figure 8:
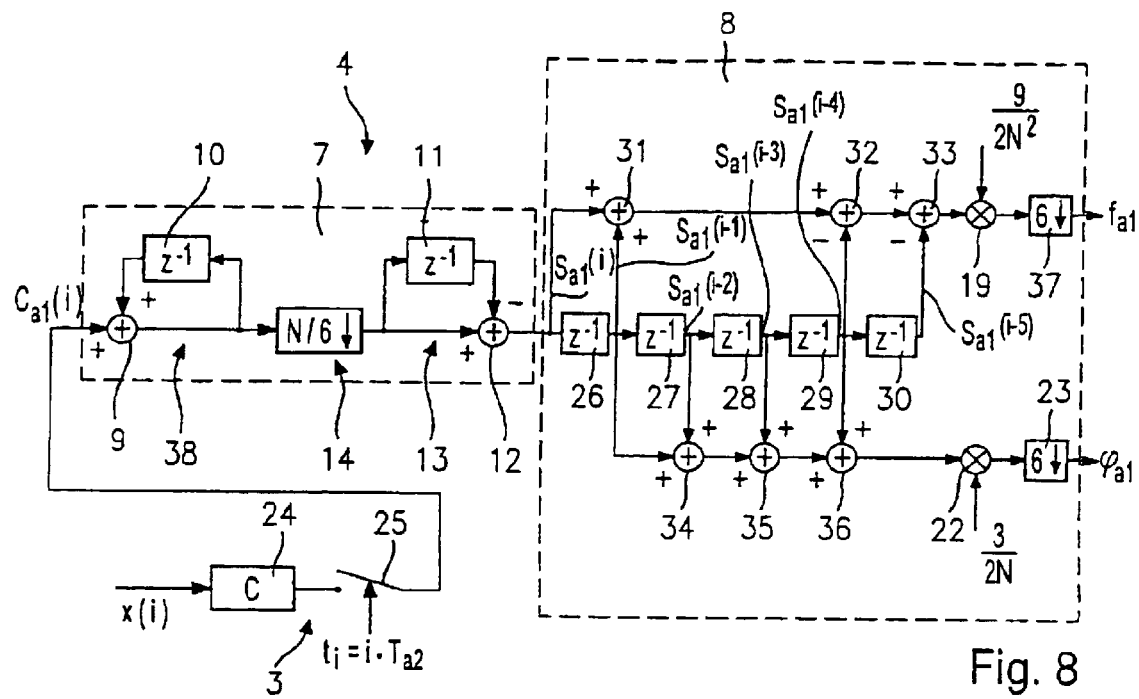
FIG. 8 is a block diagram of an embodiment of the apparatus of this invention for estimating the frequency and phase in a second embodiment of the estimator.

In the embodiment illustrated in FIG. 8, these remaining multiplications are also eliminated or replaced by bit shifting. In the embodiment illustrated in FIG. 8, elements with the same reference notations corresponding to those in the embodiment illustrated in FIG. 5 are the same, so it is not necessary to repeat the description.

First, the phase $\phi_{a1}$ is standardized to $2\pi$. Furthermore, the frequency estimate value $f_{a1}$ is standardized to the inverse of the sampling period $1/T_{a2}$. In this embodiment, a counter 24 which counts the frequency $f_{a1}$ of the input signal $x(i)$ continuously is used to create the phase values $C_{a1}(i)$ from the input sequence $x(i)$. The counter status of counter 24 is sampled or read out at times $t_i = I \cdot T_{a2}$, which is represented by switch 25. The phase values $C_{a1}(i)$ thus created are fed to the cic filter 7. Even better results can be obtained with a dual-flank counter. It should be emphasized that counter 24 is only one of the many possibilities of obtaining phase values $C_{a1}(i)$.

Figure 9:
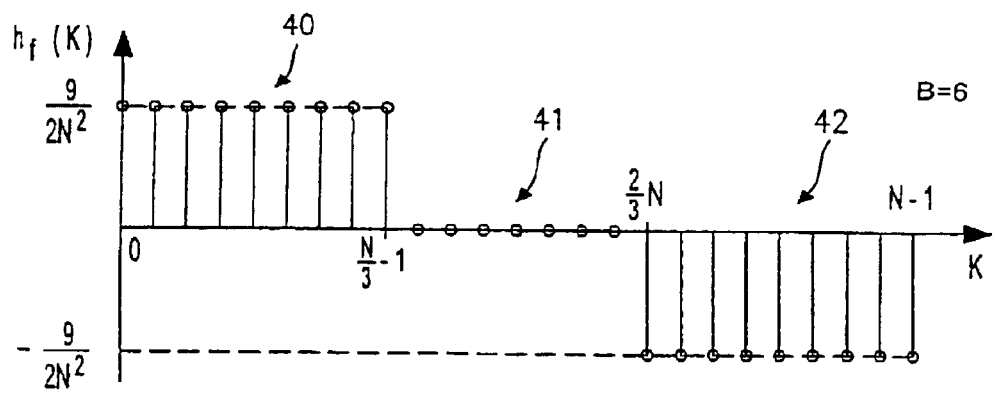
FIG. 9 is a diagram of a resulting pulse response $h_f$ for the frequency of the estimator shown in FIG. 8.

In the embodiment illustrated in FIG. 8, the sampling-rate converter 14 reduces the sampling rate $f_{a2}=1/T_{a2}$ by the factor N/6, so that cic filter 7 adds up the phase values $C_{a1}(i)$ only over the fraction $\frac{1}{6}$ of the observation length N. The added-up phase values $S_{a1}(i)$ are fed to a chain of five delay elements 26, 27, 28, 29 and 30 in the second filter 8. Since the cic filter 7 creates only a constant, positive pulse response of the length N/6, first two positive partial pulse responses immediately in succession must be combined to create the resulting pulse response $h_f$ for the frequency shown in FIG. 9 and then, delayed by N/3, two inverted partial pulse responses must be combined again in immediate succession. This can be achieved because phase values $S_{a1}(i)$ at the input of the first delay element 26 and phase values $S_{a1}(i-1)$ at the output of the first delay element 26 are fed to an adder 31 to create the positive component of the resulting pulse response $h_f$ between 0 and N/3−1. The outputs of the second delay element 27 and third delay element 28 do not enter directly into the formation of the resulting pulse response $h_f$, so that the resulting pulse response $h_f$ is identical to 0 between N/3−1 and 2N/3. The added-up phase values $S_{a1}(i-4)$ at the output of the fourth delay element 29 and $S_{a1}(i-5)$ at the output of the fifth delay element 30 are respectively fed to the minus "−" inputs of subtractors 32 and 33, with the output of the adder 31 being fed to the plus "+" input of subtractor (which could also be termed a negative adder) 32 and the output of subtractor 32 being fed to the plus "+" input of subtractor 33.

Since the value was standardized to $1/T_{a2}$ the multiplier is now $9/(2 \cdot N^2)$. In the sampling-rate converter 37, the sampling rate must be reduced by the remaining factor 6.

In the embodiment illustrated in FIG. 8, a reduced effective observation length of ⅔N is used to estimate the phase $\phi_{a1}$. To do so, the resulting pulse response $h_\phi$ for the phase is set at 0 in the interval between 0 and N/6−1 and between ⅚N and N−1 by not including the added-up phase values $S_{a1}(i)$ at the input of the first delay element 26 and $S_{a1}(i-5)$ at the output of the fifth delay element 30 in the addition to create the resulting pulse response $h_\phi$. The added-up phase values, $S_{a1}(i-1)$ at the output of the first delay element 26, $S_{a1}(i-2)$ at the output of the second delay element 27, $S_{a1}(i-3)$ at the output of the third delay element 28, and $S_{a1}(i-4)$ at the output of the fourth delay element 29, are added in the adders 34, 35 and 36. Because of the standardization to $2\pi$ and the reduction of the effective observation length from N to ⅔N, this yields a correction factor of 3/2N. In the sampling-rate converter 23, the sampling rate for the phase must still be reduced by the remaining factor 6.

Figure 10:
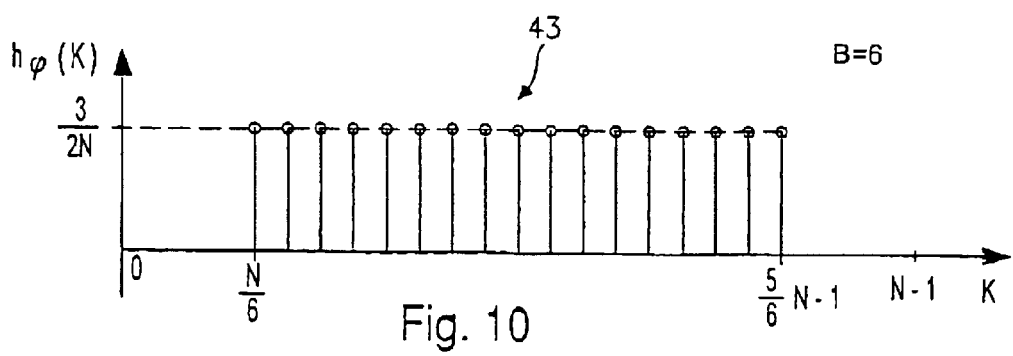
FIG. 10 is a diagram of a resulting pulse response $h_\phi$ for the phase of the estimator shown in FIG. 8.

The resulting pulse response $h_\phi$ for estimating the phase $\phi_{a1}$ is shown in FIG. 10.

The main advantage of the embodiment illustrated in FIG. 8 in comparison with the embodiment illustrated in FIG. 5 is that the two correction factors $9/(2N^2)$ and $3/(2N)$ can be created by bit shifting. This is true because if $N=3 \cdot 2^n$, where n is a whole positive number, then $9/(2 \cdot N^2)=2^{-2n-1}$. This is division by a power of 2 which, when manifested as hardware, can be represented as a displacement (shifting) operation. The same thing then also applies for the factor $3/(2N)$, because with $N=3 \cdot 2^n$ it holds that $3/(2 \cdot N)=2^{-n-1}$. This is also division by a power of 2, which can be represented as a bit shift operation in a hardware implementation. It is therefore possible to eliminate the multipliers 19 and 22, which are shown in FIG. 8 only for the sake of illustration and replace them with a reinterpretation of the value of the bits at the output of the subtractor 33 or adder 36.

This invention is not limited to the embodiments shown herein. Instead of a summation length of N/3 or N/6 in the cic filters 7, a fraction 1/B of the observation length N may also be used in general as summation length N/B, wherein then the sampling rate $f_{a2}$ must be reduced by the factor N/B in the sampling-rate converter and by factor B in the sampling-rate converters 20 and 23. To eliminate multipliers 19 and 22, it is advantageous if this fraction is $1/B=1/(3 \cdot n)$, where n is a whole positive number.

What is claimed is:

1. A method for estimating one of the frequency ($f_{a1}$) and the phase ($\phi_{a1}$) of a digital input signal (x(i)) having the following process steps:
   determining phase values ($C_{a1}(i)$) of the digital input signal (x(i)),
   summing the phase values ($C_{a1}(j)$) over a predetermined summation length N/B, which is a predetermined fraction 1/B of an observation length of N phase values ($C_{31}(i)$), to create added-up phase values ($S_{a1}(i)$), where B is a positive integer.
   reducing a sampling rate of the added-up phase values ($S_{a1}(j)$) by the factor N/B in comparison with a sampling rate ($f_{a2}$) of the phase values ($C_{a1}(i)$),
   delaying the added-up phase values ($S_{a1}(i)$) with at least B−1 delay elements, each of which delays the added-up phase values ($S_{a1}(i)$) by one sampling period of the reduced sampling rate ($f_{a2} \cdot B/N$),
   adding up the delayed added-up phase values ($S_{a1}(i)$) to create a resulting pulse response ($h_f$) of the frequency so that one of the resulting pulse responses ($h_f$) of the frequency ($f_{a1}$) is constant positive in a first interval, is zero in a second interval, and is constant negative in a third interval (42), and such that a resulting pulse response ($h_\phi$) of the phase is constant in at least a middle interval of the observation length and is otherwise zero.

2. The method of claim 1, wherein the fraction 1/B is $1/(3 \cdot n)$, where n is a positive integer.

3. The method of claim 2, wherein the fraction 1/B is ⅓, wherein a first delay element and second delay element are provided, and wherein the added-up phase value ($S_{a1}(i-2)$) at the output of the second delay element is subtracted from the added-up phase value ($S_{a1}(i)$) at the input of the first delay element to determine the estimated frequency ($f_{a1}$).

4. The method of claim 2, wherein the fraction 1/B is ⅓, wherein a first delay element and second delay element are provided, and wherein the added-up phase value ($S_{a1}(i)$) at the input of the first delay element, the added-up phase value ($S_{a1}(i)$) at the output of the first delay element, and the added-up phase value ($S_{a1}(i-2)$) at the output of the second delay element are summed to determine the estimated phase ($\phi_{a1}$).

5. The method of claim 2, wherein the fraction 1/B is ⅙, wherein a first, second, third, fourth, and fifth delay elements are provided, and wherein the added-up phase value at the input of the first delay element and the added-up phase value ($S_{a1}(i-1)$) at the output of the first delay element are added, and from this the added-up phase values ($S_{a1}(i-4)$) at the output of the fourth delay element and ($S_{a1}(i-5)$) at the output of the fifth delay element are subtracted to determine the estimated frequency ($f_{a1}$).

6. The method of claim 2, wherein the fraction 1/B is equal to ⅙, wherein a first, second, third, fourth, and fifth delay elements are provided, and the added-up phase values ($S_{a1}(i-1)$) at the output of the first delay element, ($S_{a1}(i-2)$) at the output of the second delay element, ($S_{a1}(i-3)$) at the output of the third delay element and ($S_{a1}(i-4)$) at the output of the fourth delay element are summed to determine the estimated phase ($\phi_{a1}$).

7. The method of claim 1, wherein each of the first interval, the second interval, and the third interval of the resulting pulse response ($h_f$) of the frequency has a length of N/B, in particular ⅓ N.

8. The method of claim 1, wherein the middle interval of the resulting pulse response ($h_\phi$) of the phase has the length $N \cdot (3n-n)/3 \cdot n$, in particular ⅔ N, where n is a positive integer.

9. The method of claim 1, wherein the middle interval of the resulting pulse response ($h_\phi$) extends over the total observation length N.

10. An apparatus for estimating the frequency ($f_{a1}$) and/or the phase ($\phi_{a1}$) of a digital input signal (x(i)), the apparatus comprising:
   a phase determining device, which determines phase values ($C_{a1}(i)$) of the digital input signal (x(i)), a first filter, which adds up the phase values ($C_{a1}(i)$) over a predetermined summation length N/B, which is a predetermined fraction 1/B of an observation length of N phase values ($C_{a1}(i)$), to form added-up phase values ($S_{a1}(i)$), and the sampling rate of the added-up phase values ($S_{a1}(i)$) is reduced by a factor N/B in comparison with a sampling rate ($f_{a2}$) of the phase values ($C_{a1}(i)$), where B is a positive integer.

a second filter which delays the added-up phase values ($S_{a1}(i)$) in a chain of at least B−1 delay elements which respectively delay the added-up phase values ($S_{a1}(i)$) by one sampling period of the reduced sampling rate ($f_{a2} \cdot B/N$), and adds or subtracts the delayed added-up phase values ($S_{a1}(i)$) to create a resulting pulse response ($h_f$) of the frequency so that at least one of: a resulting pulse response ($h_f$) of the frequency is constant positive in a first interval, is zero in a second interval, or is constant negative in a third interval, and wherein a resulting pulse response ($h_\phi$) of the phase is created so that the resulting pulse response ($h_\phi$) of the phase is constant in at least a middle interval and is otherwise zero.

11. The apparatus of claim 10, wherein the phase determination device has a counter whose count is read out at a constant sampling rate ($f_{a2}$).

12. The apparatus of claim 10, wherein the first filter has an integrator, a differentiator and a first sampling-rate converter arranged between the integrator and the differentiator to reduce the sampling rate of the added-up phase values ($S_{a1}(i)$) by the factor N/B in comparison with the sampling rate frequency ($f_{a2}$) of the phase values ($C_{a1}(i)$).

13. The apparatus of claim 10, wherein the fraction 1/B is ⅓, and the second filter has a first delay element and a second delay element and a subtractor, which subtracts the added-up phase values ($S_{a1}(i-2)$) at the output of the second delay element from the added-up phase values ($S_{a1}(i)$) at the input of the first delay element to determine the estimated frequency ($f_{a1}$).

14. The apparatus of claim 10, wherein the fraction 1/B is ⅓, and the second filter has a first delay element and a second delay element and adders which sum the added-up phase values ($S_{a1}(i)$) at the input of the first delay element, the added-up phase values ($S_{a1}(i-1)$) at the output of the first delay element, and the added-up phase values ($S_{a1}(i-2)$) at the output of the second delay element to determine the estimated phase ($\phi_{a1}$).

15. The apparatus of claim 13, wherein a second sampling-rate converter is arranged to follow at least one of the adders and the subtractor to reduce the sampling rate by a factor of 3.

16. The apparatus of claim 10, wherein the fraction 1/B is ⅙, and the second filter has a first, second, third, fourth, and fifth delay elements, an adder that adds up the added-up phase values ($S_{a1}(i)$) at the input of the first delay element and the added-up phase values ($S_{a1}(i-1)$) at the output of the first delay element, and subtractors which subtract therefrom the added-up phase values ($S_{a1}(i-4)$) at the output of the fourth delay element and the added-up phase values ($S_{a1}(i-5)$) at the output of the fifth delay element to determine the estimated frequency ($f_{a1}$).

17. The apparatus of claim 10, wherein the fraction 1/B is ⅙, and the second filter has a first, second, third, fourth, and fifth delay elements and adders which add up the added-up phase values ($S_{a1}(i-1)$) at the output of the first delay element, the added-up phase values ($S_{a1}(i-2)$) at the output of the second delay element, the added-up phase values ($S_{a1}(i-3)$) at the output of the third delay element and the added-up phase values ($S_{a1}(i-4)$) at the output of the fourth delay element to determine the estimated phase ($\phi_{a1}$).

18. The apparatus of claim 16, wherein a second sampling-rate converter is respectively arranged after at least one of the adders and the subtractors for reducing the sampling rate by a factor of 6.

* * * * *